(12) United States Patent
Luo et al.

(10) Patent No.: US 11,855,243 B2
(45) Date of Patent: Dec. 26, 2023

(54) LIGHT-EMITTING DEVICE AND BACKLIGHT MODULE

(71) Applicant: Wistron Corporation, New Taipei (TW)

(72) Inventors: Bin Luo, New Taipei (TW); Rui-Hua Wang, New Taipei (TW); Chih-Chou Chou, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 84 days.

(21) Appl. No.: 17/341,908

(22) Filed: Jun. 8, 2021

(65) Prior Publication Data

US 2022/0320384 A1 Oct. 6, 2022

(30) Foreign Application Priority Data

Mar. 30, 2021 (CN) .......................... 202110343310.3

(51) Int. Cl.
*H01L 33/00* (2010.01)
*H01L 33/54* (2010.01)
(Continued)

(52) U.S. Cl.
CPC ........ *H01L 33/54* (2013.01); *G02F 1/133603* (2013.01); *G02F 1/133607* (2021.01); *H01L 33/56* (2013.01); *H01L 33/58* (2013.01)

(58) Field of Classification Search
CPC ................ G02F 1/133607; G02F 1/133603
See application file for complete search history.

(56) References Cited

U.S. PATENT DOCUMENTS

2015/0009452 A1   1/2015 Lee
2018/0058661 A1*  3/2018 Shim .................. G02B 19/0061

FOREIGN PATENT DOCUMENTS

KR   20170073237 A  *  6/2017  ............. F21K 99/00
TW      200717131 A      5/2007
(Continued)

OTHER PUBLICATIONS

Mary G. Turner, Kevin J. Garcia, "Optimization using rational Bézier control points and weighting factors," Proc. SPIE 7061, Novel Optical Systems Design and Optimization Xi, 70610H (Sep. 11, 2008); doi: 10.1117/12.798523 (Year: 2008).*

(Continued)

*Primary Examiner* — Gerald J Sufleta, II
(74) *Attorney, Agent, or Firm* — McClure, Qualey & Rodack, LLP

(57) ABSTRACT

A light-emitting device is applicable to a backlight module. The light-emitting device includes a substrate, a light-emitting diode (LED) and an encapsulation body. The encapsulation body is on the substrate and covers the LED. The encapsulation body includes a base and a lens. The base has a base surface. The lens has a lens surface. The lens surface conforms to a cubic Bezier curve. The cubic Bezier curve has a start point and an end point. The start point of the cubic Bezier curve is at the base surface. The end point of the cubic Bezier curve corresponds to the center of the LED. The lens surface is provided with a concave portion at the end point. The lens increases the light-emitting angle of the LED, so that the spacing between light-emitting devices can be increased, thereby reducing the number of light-emitting devices to be used and the costs.

19 Claims, 16 Drawing Sheets

(51) Int. Cl.
*H01L 33/56* (2010.01)
*G02F 1/1335* (2006.01)
*G02F 1/13357* (2006.01)
*H01L 33/58* (2010.01)

(56) References Cited

FOREIGN PATENT DOCUMENTS

| TW | 201411887 A | 3/2014 |
|----|-------------|--------|
| TW | 202017204 A | 5/2020 |

OTHER PUBLICATIONS

Trofimuk, A.A. "Using Bezier curves in the automatic design of nonimaging optical systems" (Year: 2013).*

* cited by examiner

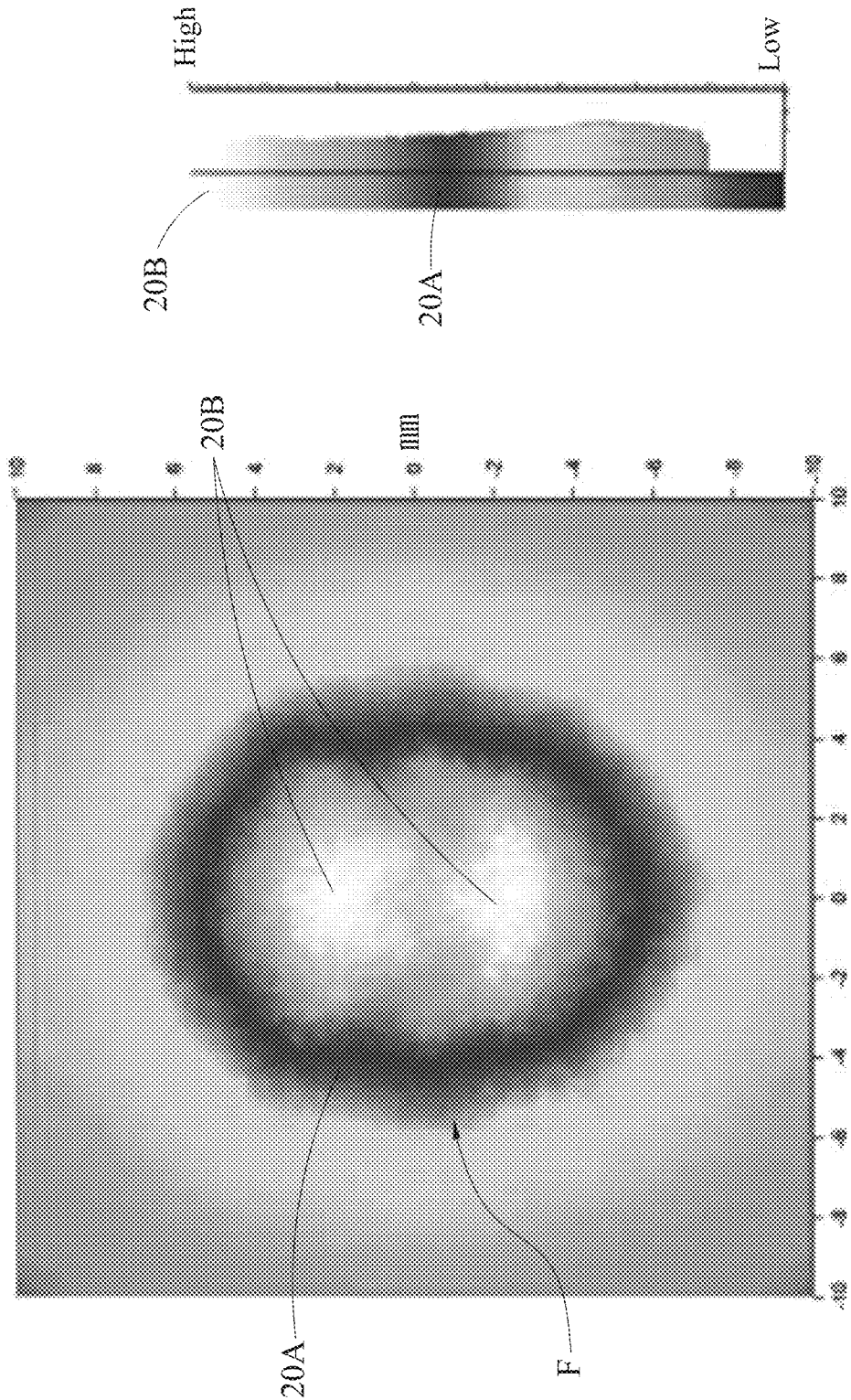

LIGHT-EMITTING DEVICE AND BACKLIGHT MODULE

CROSS-REFERENCE TO RELATED APPLICATION

This non-provisional application claims priority under 35 U.S.C. § 119(a) to Patent Application No. 202110343310.3 filed in China, P.R.C. on Mar. 30, 2021, the entire contents of which are hereby incorporated by reference.

BACKGROUND

Technical Field

The present disclosure relates to a light-emitting device and a backlight module, and more particularly relates to a light-emitting device with Mini LEDs and a backlight module with a Mini LED.

Related Art

A liquid crystal display uses a backlight module as a light source. The backlight module is disposed at a back side of a display panel and provides uniform light rays for the display panel to achieve the purpose of displaying images. The backlight module includes various kinds of optical assemblies, such as assemblies of light guide plates, and uses a point light source of a Mini LED (Mini light-emitting diode) as a main light supply source. The light-emitting angle of each Mini LED is constant. For example, under the condition of the use area in the backlight module of 24 inches, when each Mini LED is used, arranged and distributed in a whole cavity of the backlight module in horizontal axis and longitudinal axis directions at an interval of 10 mm, 53×29, totaling 1537 Mini LEDs are needed. The quantity of the Mini LEDs and the cost are high.

SUMMARY

In view of this, according to some embodiments, a light-emitting device includes a substrate, a light-emitting diode and an encapsulation body. The light-emitting diode is located at one side of the substrate. The encapsulation body is located at one side of the substrate and covers the light-emitting diode. The encapsulation body includes a base and a lens. The lens corresponds to a position above the light-emitting diode. The lens has a lens surface. The lens surface conforms to a cubic Bezier curve. The cubic Bezier curve has a start point and an end point. The start point of the cubic Bezier curve is located at a base surface of the base. The end point corresponds to a position above the light-emitting diode. The lens surface is provided with a concave portion at the end point.

In some embodiments, the lens surface is a curve surface formed by rotating the cubic Bezier curve for 360 degrees around a center axis. The center axis is a plumb line passing through the end point. The plumb line and a Z axis are located on the same axial line. A plumb tangent plane of the base surface is located on the same axial line as a Y axis. The Z axis intersects with and is vertical to the Y axis. The start point is located in a coordinate position with the Y axis being substantially equal to 0. The end point is located in a coordinate position with the Z axis being substantially equal to 0.

In some embodiments, the base has a height and a length. A parameter value range of the cubic Bezier curve is as follows: a coordinate range of the start point is (−77%×the length/2, the Y axis being substantially equal to 0) to (−91%×the length/2, the Y axis being substantially equal to 0), a start point angle is formed by the start point between the Y axis and a tangent line tangent to the cubic Bezier curve, the start point angle is $\tan \beta$ equal to 8.80, a start point weight is 0.44 to 0.50, a start point tangent length is 0.300 mm, a coordinate of the end point is (17%×the height, the Z axis being substantially equal to 0) to (33%×the height, the Z axis being substantially equal to 0), an end point angle is formed by the end point between the Z axis and the tangent line tangent to the cubic Bezier curve, the end point angle is $\tan \alpha$ equal to −1.75, an end point weight is 0.42 to 0.46, and an end point tangent length is 0.275 mm.

In some embodiments, the encapsulation body is made of an encapsulation glue material. A refractive index of the lens is 1.52.

In some embodiments, the encapsulation body is made of an encapsulation glue material of epoxy resin, silicone or silicone resin.

In some embodiments, a light-emitting angle of the lens is 166.30 degrees at 50% power of light distribution curve calculation.

In some embodiments, a light spot covering range with the area of 94.20 mm$^2$ is measured in a position being 5 mm above the light-emitting diode.

In some embodiments, the height of the base is 0.3 mm. The length of the base is 1.3 mm.

In some embodiments, the lens surface is provided with a gradually reducing concave portion bending to form an arc shape from outside to inside at the end point, the concave portion has a conical appearance, the conical appearance tapers from the lens surface toward the light-emitting diode.

According to some embodiments, a backlight module is provided, which includes a circuit board, a plurality of light-emitting devices, a diffusion sheet and a plurality of optical films. The light-emitting devices are located on the circuit board. The light-emitting devices includes a substrate, a light-emitting diode and an encapsulation body. The light-emitting diode is located at one side of the substrate. The encapsulation body is located at one side of the substrate and covers the light-emitting diode. The encapsulation body includes a base and a lens. The lens corresponds to a position above the light-emitting diode. The lens has a lens surface. The lens surface conforms to a cubic Bezier curve. The cubic Bezier curve has a start point and an end point. The start point of the cubic Bezier curve is located at a base surface of the base. The end point corresponds to a position above the light-emitting diode. The lens surface is provided with a concave portion at the end point. The diffusion sheet is located above the circuit board and has an interval from the circuit board. Each of the optical films is located on the diffusion sheet.

In some embodiments, an X axis and a Y axis in intersecting, vertical and horizontal states are defined on the circuit board. The light-emitting devices are disposed at an arrangement distance of 16 mm in the X axis and Y axis directions on the circuit board.

Based on the above, according to some embodiments, the light-emitting device is provided with the lens for forming the lens surface by the cubic Bezier curve. The lens increases the light-emitting angle of the light-emitting diode. Under the conditions of occupying the same use area in the backlight module and ensuring the image effect, the spacing between light-emitting devices can be increased, thereby greatly reducing the number of light-emitting devices to be used and reducing the cost of the whole backlight module.

BRIEF DESCRIPTION OF THE DRAWINGS

FIGS. 20a and 20b illustrate a schematic diagram of a light spot of the cubic Bezier curve at the maximum parameter value according to some embodiments;

DETAILED DESCRIPTION

Figure 1:
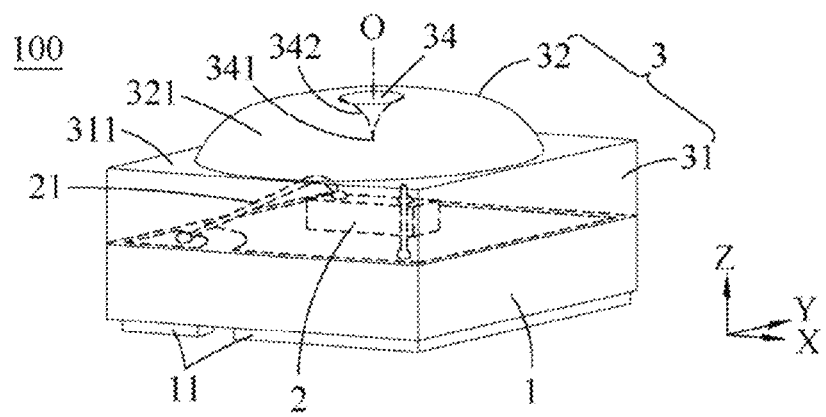
FIG. 1 illustrates a schematic diagram of an appearance of a light-emitting device according to some embodiments.
Figure 2:
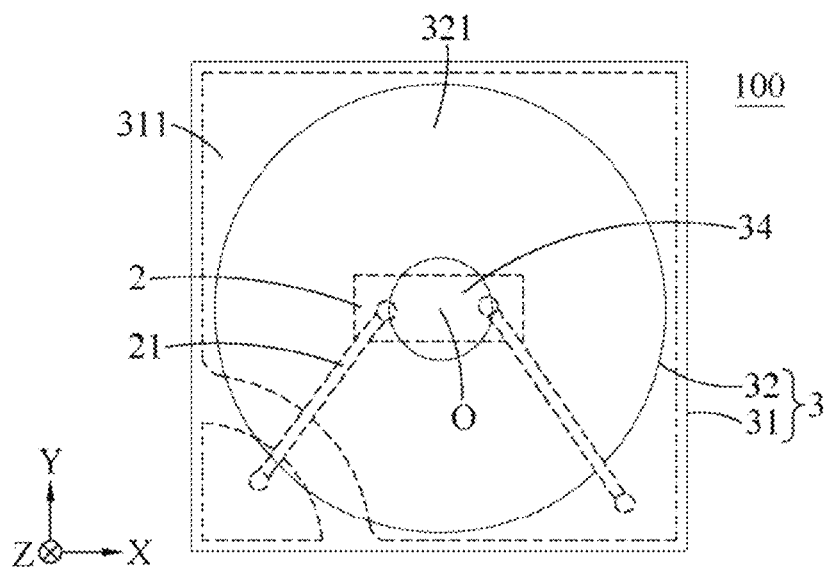
FIG. 2 illustrates a schematic top view of the light-emitting device according to some embodiments.
Figure 3:
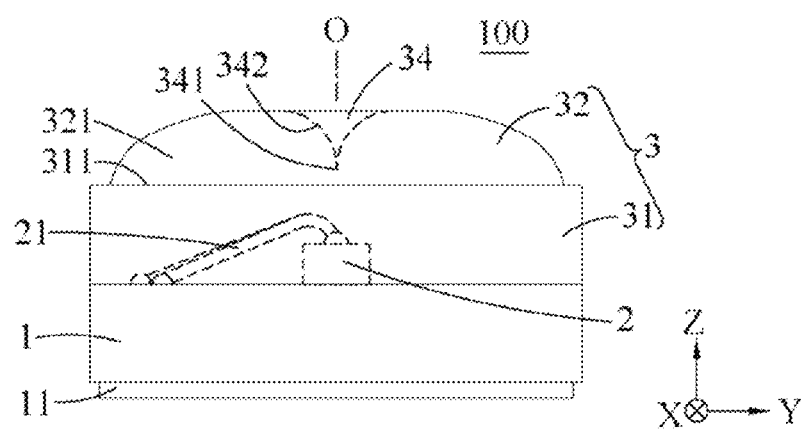
FIG. 3 illustrates a schematic lateral view of the light-emitting device according to some embodiments.
Figure 4:
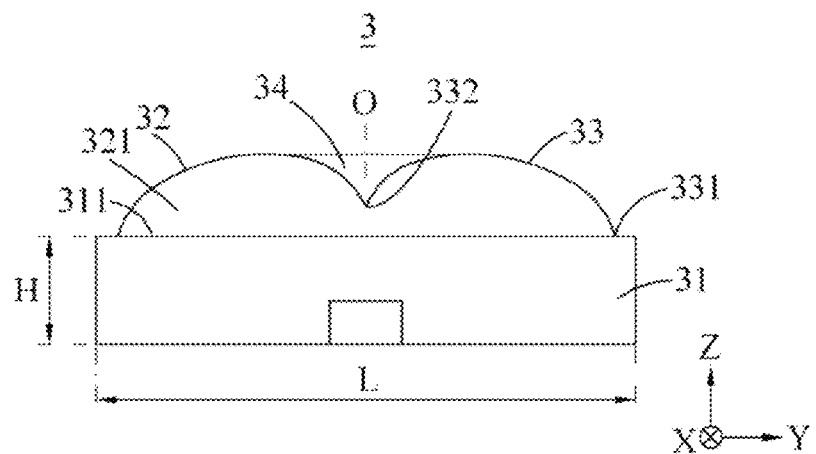
FIG. 4 illustrates a schematic lateral view of a base and a lens according to some embodiments.
Figure 5:
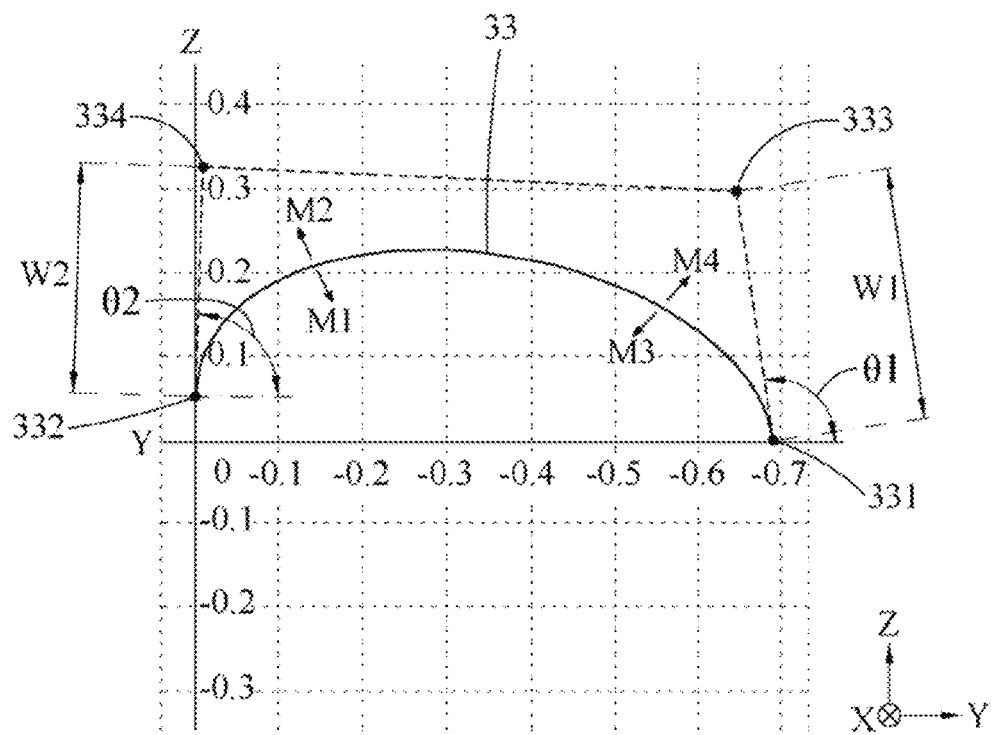
FIG. 5 illustrates a schematic enlarged lateral view of a local appearance of the lens according to some embodiments.

Referring to FIG. 1 to FIG. 5, FIG. 1 is a schematic diagram of an appearance of a light-emitting device 100, FIG. 2 is a schematic top view of the light-emitting device 100, FIG. 3 is a schematic lateral view of the light-emitting device 100, FIG. 4 is a schematic lateral view of a base 31 and a lens 32, and FIG. 5 is a schematic enlarged lateral view of a local appearance of the lens 32. In some embodiments, a size of a light-emitting diode (LED) chip in the light-emitting device 100 is miniaturized to 75 μm to 300 μm through an LED technology. The light-emitting device 100 includes a substrate 1, a light-emitting diode 2 and an encapsulation body 3.

The light-emitting diode 2 is located at one side of the substrate 1.

The encapsulation body 3 is located at one side of the substrate 1 and covers the light-emitting diode 2. The encapsulation body 3 includes a base 31 and a lens 32. The lens 32 corresponds to a position above the light-emitting diode 2. The lens 32 has a lens surface 321. The lens surface 321 conforms to a cubic Bezier curve 33. The cubic Bezier curve 33 has a start point 331 and an end point 332. The start point 331 is located at a base surface 311 of the base 31. The end point 332 corresponds to a position above the light-emitting diode 2 (for example, but not limited to the center of the light-emitting diode 2). The lens surface 321 is provided with a concave portion 34 at the end point 332.

Referring to FIG. 1 to FIG. 3, in some embodiments, the light-emitting diode 2 is connected with a gold wire 21. The light-emitting diode 2 is fixed to the surface of the substrate 1. The gold wire 21 is configured to connect a surface joint of the substrate 1 with the light-emitting diode 2. The bottom of the substrate 1 is provided with a silver-plated copper sheet 11. The light-emitting diode 2 is a mini light-emitting diode chip (Mini LED chip).

Referring to FIG. 2 to FIG. 3, in some embodiments, the encapsulation body 3 is injection-molded by an encapsulation glue material, and covers the light-emitting diode 2 for protection. The size of the base 31 and the lens 32 after molding with the encapsulation glue is smaller than the size of the substrate 1. When the substrate 1 is placed into a processing mold, and the processing mold is filled with the encapsulation glue, the injected encapsulation glue will cover the light-emitting diode 2 on the substrate 1. After the encapsulation glue is cured and molded into the encapsulation body 3, the encapsulation glue can be prevented from flowing to a position under the substrate 1.

In some embodiments, when the light-emitting device 100 is injection-molded by the encapsulation glue material, the encapsulation body 3 is made of the encapsulation glue material of epoxy resin, a refractive index of the encapsulation body 3 is 1.52, and an effect of high refractive index is achieved.

Referring to FIG. 1, FIG. 4 and FIG. 5, in some embodiments, a shape of the cubic Bezier curve 33 consists of parameters of a coordinate of the start point 331, a start point angle θ1(tan β), a start point weight, a start point tangent length W1, a coordinate of the end point 332, an end point angle θ2(tan α), an end point weight, an end point tangent length W2 and the loke. The end point 332 is aligned with the center of the light-emitting diode 2, and the center of the lens 32 corresponds to the center of the light-emitting diode 2.

Referring to FIG. 1, FIG. 4 and FIG. 5, in some embodiments, the lens surface 321 conforms to the cubic Bezier curve 33 refers to two mutually mirroring cubic Bezier curves 33 on a plumb tangent plane (observed from the cross section of the lens 32, the end points 332 of the two cubic Bezier curves 33 are connected). In some embodiments, the lens 32 on the base 31 is a 360-degree rotating body, and shows an appearance in a donut shape as shown in the figure. A lens of the Mini LED generally has a regular cuboid appearance (not shown in the figure).

In some embodiments, the lens surface 321 is a curve surface formed by rotating for 360 degrees by taking a plumb line passing through the end point 332 as the center. That is, the lens surface 321 is a curve surface formed by rotating the cubic Bezier curve 33 for 360 degrees around a center axis O. The center axis O is a plumb line passing through the end point 332. The plumb line and a Z axis are located on the same axial line. A plumb tangent plane of the base surface 311 is located on the same axial line as a Y axis, and the Z axis intersects with and is vertical to the Y axis. The start point 331 is located in a coordinate position with the Y axis being substantially equal to 0, and the end point 332 is located in a coordinate position with the Z axis being substantially equal to 0. In other words, the cubic Bezier curve 33 on the lens 32 is a curve formed by rotating for a circle by taking the center axis O of the base 31 as a center.

Referring to FIG. 4, in some embodiments, a height H of the base 31 can be selected in a value range of 0.25 mm to 0.35 mm, a length L of the base 31 can be selected in a value range of 0.8 mm to 1.8 mm. A ratio of the height H of the base 31 to the length L of the base 31 is 1/8:1/2. In some embodiments, the height H of the base 31 is 0.3 mm, and the length L of the base 31 is 1.3 mm.

| Parameter table of cubic Bezier curve Parameter value range of cubic Bezier curve | |
|---|---|
| Coordinate of start point | (−77% × L/2.0) to (−91% × L/2.0) |
| Start point-tanβ | 8.80 |
| Start point weight | 0.44 to 0.50 |
| Start point tangent length | 0.300 |
| Coordinate of end point | (0.17% × H) to (0.33% × H) |
| End point-tanα | −1.75 |
| End point weight | 0.42 to 0.46 |
| End point tangent length | 0.275 |

Referring to the above table and FIG. 1, FIG. 4 and FIG. 5, in some embodiments, observed from the cross section of the base 31, the base 31 has the height H and the length L. The parameter value range of the cubic Bezier curve 33 is as follows: a coordinate range of the start point 331 is (−77%× L/2, the Y axis being substantially equal to 0) to (−91%×L/2, the Y axis being substantially equal to 0), a start point angle θ1 is formed by the start point 331 between the Y axis and a tangent line tangent to the cubic Bezier curve 33, the start point angle Γ1 is tan β equal to 8.80, a start point weight factor is 0.44 to 0.50 (the curve can be correspondingly controlled to inwards move M1 or outwards move M2 according to the value), a start point tangent length W1 is 0.300 mm, a coordinate of the end point 332 is (the Z axis being substantially equal to 0, 17%×H) to (the Z axis being substantially equal to 0, 33%×H), an end point angle θ2 is formed by the end point 332 between the Z axis and the tangent line tangent to the cubic Bezier curve 33, the end point angle θ2 is tan α equal to −1.75, an end point weight factor is 0.42 to 0.46 (the curve can be correspondingly controlled to inwards move M3 or outwards move M4 according to the value), and an end point tangent length W2 is 0.275 mm.

Referring to FIG. 1, FIG. 4 and FIG. 5, in some embodiments, when the start point weight factor is 0 to 0.5, the cubic Bezier curve 33 in a position adjacent to the start point 331 is finely adjusted and controlled to inwards move M1 in the arrow direction as shown in the figure (move in a direction towards the base 31). In some embodiments, when the start point weight factor is 0.5 to 1.0, the cubic Bezier curve 33 in the position adjacent to the start point 331 is finely adjusted and controlled to outwards move M2 in the arrow direction as shown in the figure (move in a direction away from the base 31).

Referring to FIG. 1, FIG. 4 and FIG. 5, in some embodiments, when the end point weight factor is 0 to 0.5, the cubic Bezier curve 33 in a position adjacent to the end point 332 is finely adjusted and controlled to inwards move M3 in the arrow direction as shown in the figure (move in a direction towards the base 31). In some embodiments, when the end point weight factor is 0.5 to 1.0, the cubic Bezier curve 33 in the position adjacent to the end point 332 is finely adjusted and controlled to outwards move M4 in the arrow direction as shown in the figure (move in a direction away from the base 31).

Figure 6:
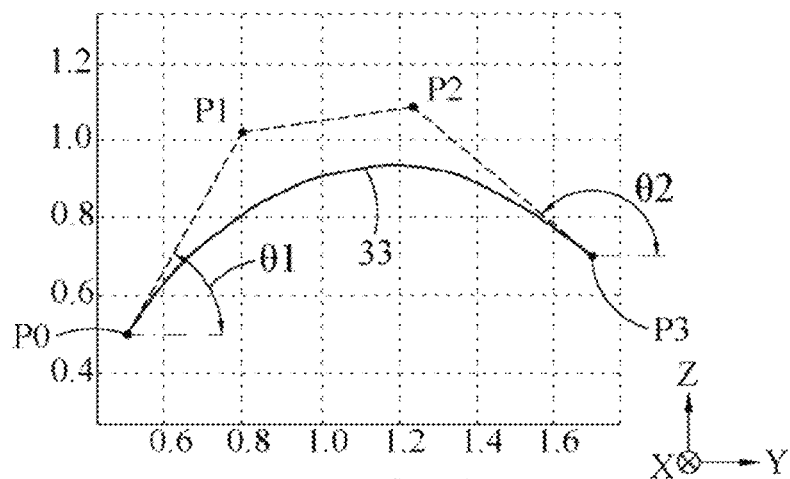
FIG. 6 illustrates a schematic diagram of a local appearance of a built cubic Bezier curve to build a fixed-point parameter according to some embodiments.
Figure 7:
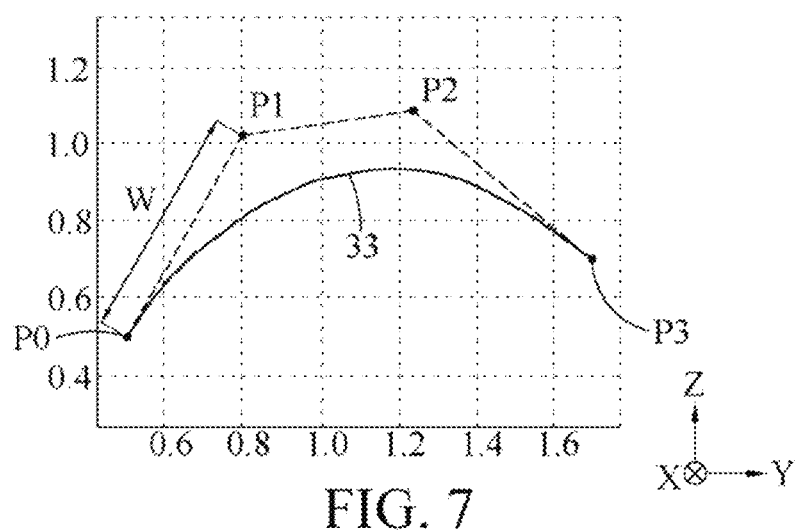
FIG. 7 illustrates a schematic diagram of the local appearance of the built cubic Bezier curve to build a tangent length parameter according to some embodiments.
Figure 8:
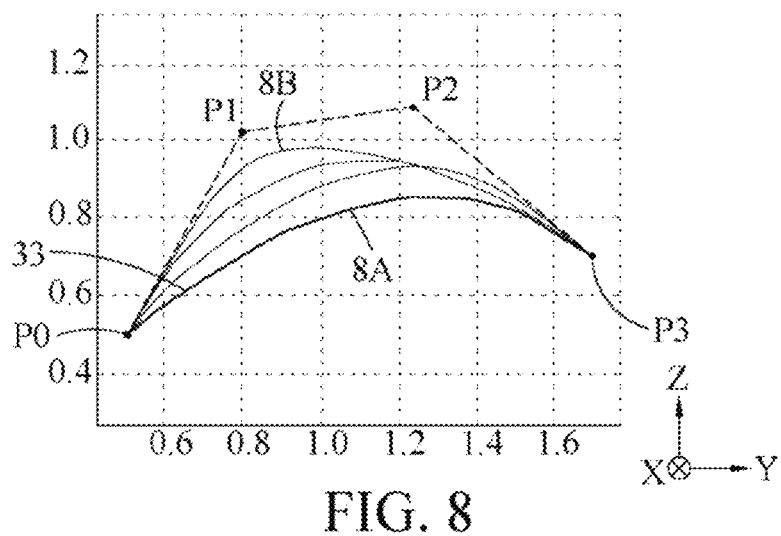
FIG. 8 illustrates a schematic diagram of the local appearance of the built cubic Bezier curve to build a weight parameter according to some embodiments.

Referring to FIG. 6 to FIG. 8, FIG. 6 is a schematic diagram of a local appearance of the built cubic Bezier curve 33 to build a fixed-point parameter, FIG. 7 is a schematic diagram of the local appearance of the built cubic Bezier curve 33 to build a tangent length W parameter, and FIG. 8 is a schematic diagram of the local appearance of the built cubic Bezier curve 33 to build a weight parameter. In some embodiments, a general cubic Bezier curve 33 has 5 parameters, which are respectively parameters of four points P0, P1, P2 and P3 and a parameter t. A parameter formula of the cubic Bezier curve 33 is $B(t)=P0(1-t)^3+3P1t(1-t)^2+3P2t^2(1-t)+P3t^3$, $t \in [0,1]$. The four points P0, P1, P2 and P3 define the cubic Bezier curve 33 in a plane or three-dimensional space. The curve starts from P0 to move towards P1, and reaches P3 from P2, and t is a parameter between 0 and 1.

Referring to FIG. 6 and FIG. 7, in some embodiments, the cubic Bezier curve 33 is used to calculate the tangent angle and curve in a tangent line mode. Angles of tangent vectors of the start point 331 (P0) and the end point 332 (P3) are obtained by the tangent angle. The built tangent length is not zero. The tangent angle is calculated, and the tangent length W is given out. Referring to FIG. 5 together, a distance among the start point 331 (P0), the end point 332 (P3), a first control point 333 (P1) and a second control point 334 (P2) is built.

Referring to FIG. 8, in some embodiments, the cubic Bezier curve 33 is controlled to realize fine adjustment of the position through the weight. By increasing the weight factor, the curve can be outwards moved. By reducing the weight factors, the curve can be inwards moved. An effective value range is 0 to 1. As shown in the figure, mark 8A is a position in which the curve controlled by the value 0 of the weight factor is located. As shown in the figure, mark 8B is a position in which the curve controlled by the value 0.75 of the weight factor is located.

Figure 9:
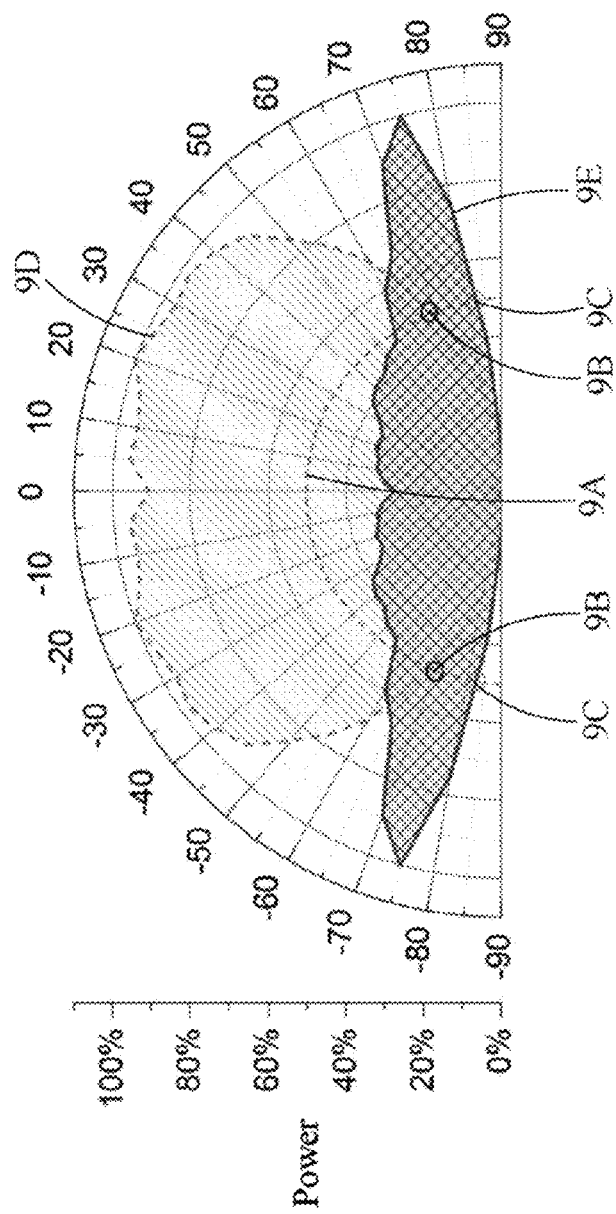
FIG. 9 illustrates a schematic diagram of light-emitting characteristics of the light-emitting device, and a light-emitting angle comparison diagram of a general Mini LED and the light-emitting device according to some embodiments.

Referring to FIG. 9, FIG. 9 is a schematic diagram of light-emitting characteristics of the light-emitting device 100, and a light-emitting angle comparison diagram of a general Mini LED and the light-emitting device 100. In the figure, the left side is power values in percentage, and the middle is angle values. The light distribution curve comparison of the general Mini LED and the light-emitting device 100 is performed (by taking epoxy resin as the encapsulation glue material as an example, the refractive index is 1.52).

In some embodiments, as shown in the figure, 50% power is a mark 9A marking point, a mark 9B marking point is a general Mini LED light-emitting angle, and a mark 9C marking point is a light-emitting angle of the light-emitting diode 2. At 50% power (mark 9A marking point), the light distribution curve of the light-emitting device 100 is calculated by optical simulation software. The light-emitting angle of the light-emitting device 100 is improved to 166.30 degrees from the original 136.30 degrees. Light rays emitted out from the light-emitting diode 2 are reflected and refracted through the base 31 and the lens 32, and the effective diffusion angle of the light rays is effectively improved. At 50% power, the light-emitting angle range of the light-emitting diode 2 is about −80 degrees to 80 degrees. The light-emitting angle is 166.30 degrees.

In some embodiments, the pointed end of the rightmost side of the light distribution curve of the light-emitting device 100 corresponds to the intensity of about 90% to 100% power. The middle 0-degree position of the light distribution curve of the light-emitting device 100 corresponds to the intensity of about 30% power. As shown in the figure, the light rays of the general Mini LED are gathered by the lens 32. An irradiation angle is shown as a mark 9D region. Light rays of the light-emitting device 100 are diffused by the lens 32, and an irradiation angle is shown as a mark 9E region. The irradiation is average, and the irradiation region is a wider region.

Figures 10A, 10B:
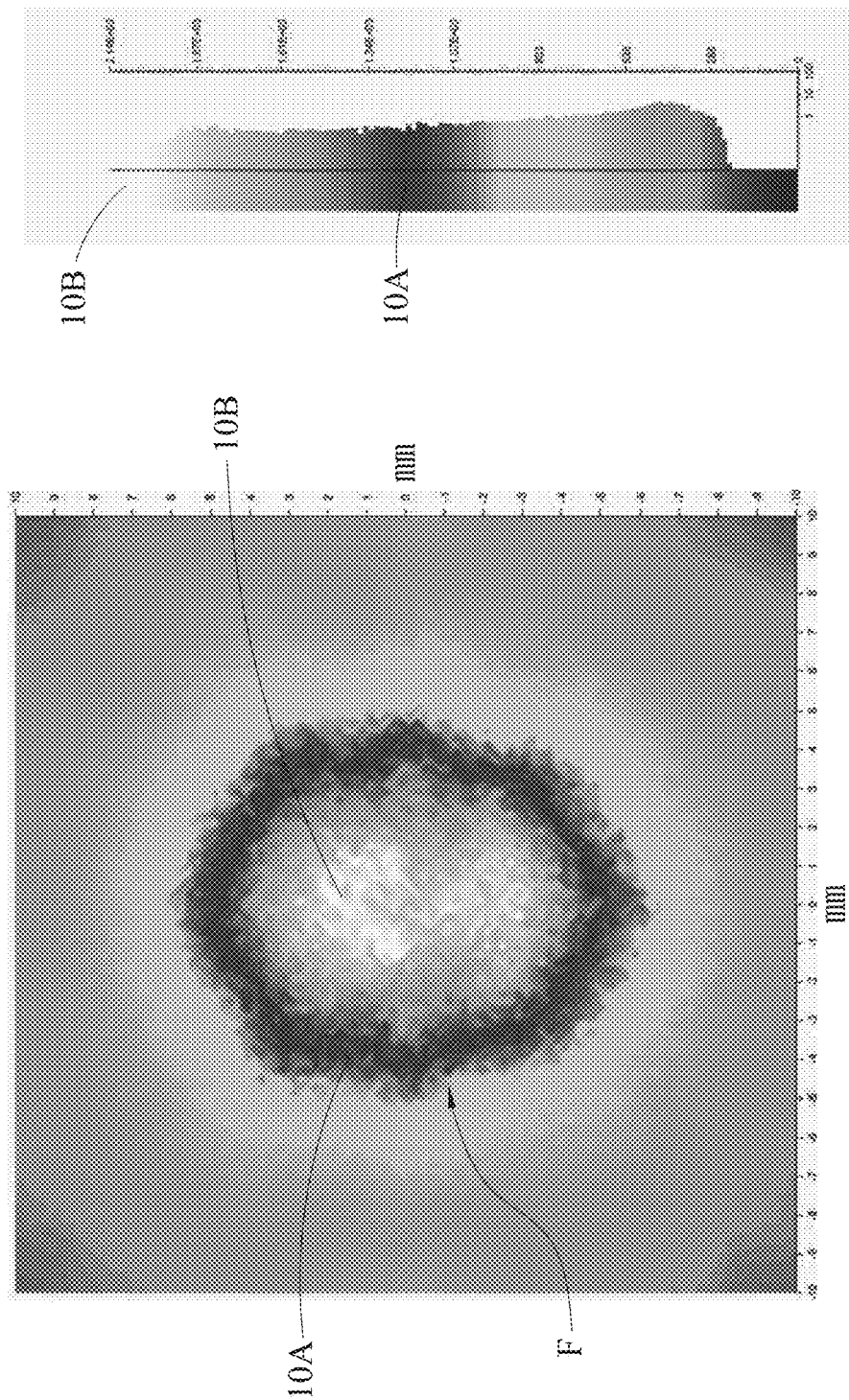
FIGS. 10a and 10b illustrate a schematic diagram of a light spot of the light-emitting device according to some embodiments.

Referring to FIGS. 10a and 10b, FIG. 10a is a schematic diagram of a light spot of the light-emitting device. In some embodiments, a test plane is disposed in a position being 5 mm above the light-emitting diode 2. An oval light spot F (as shown by mark 10A in the figure) with the area being about 94.20 mm$^2$ is formed by the light-emitting device 100 on the test plane. FIG. 10b shows an energy chart. When the light-emitting angle of the light-emitting device 100 is large, the formed light spot F relatively becomes bigger. A round light spot with the area being about 50.24 mm$^2$ is formed by the general Mini LED on the test plane. Through the image superposition comparison (not shown in the figure) of two light spots of the light-emitting device 100 and the general Mini LED, the covering range area of the light spot F of the light-emitting device 100 is obviously greater than the covering range of the light spot of the general Mini LED.

In some embodiments, by taking the uniformity of the light-emitting device 100 as an example, the intensity of inside region mark 10B (shown as a colorless white block) of mark 10A in the figure is the highest, the inside region mark 10B corresponds to the highest value portion of mark 10B at the upper side of the energy chart at the right side in the figure, the light is diffused, and the light range is increased. In some embodiments, the intensity of the inside region mark 10B is adjusted to be reduced, so that the covering range of the whole light spot F is increased, i.e., the light-emitting angle of the light-emitting diode 2 is increased, and a spacing D between the light-emitting diodes 2 is increased (as shown in FIG. 11).

Figure 11:
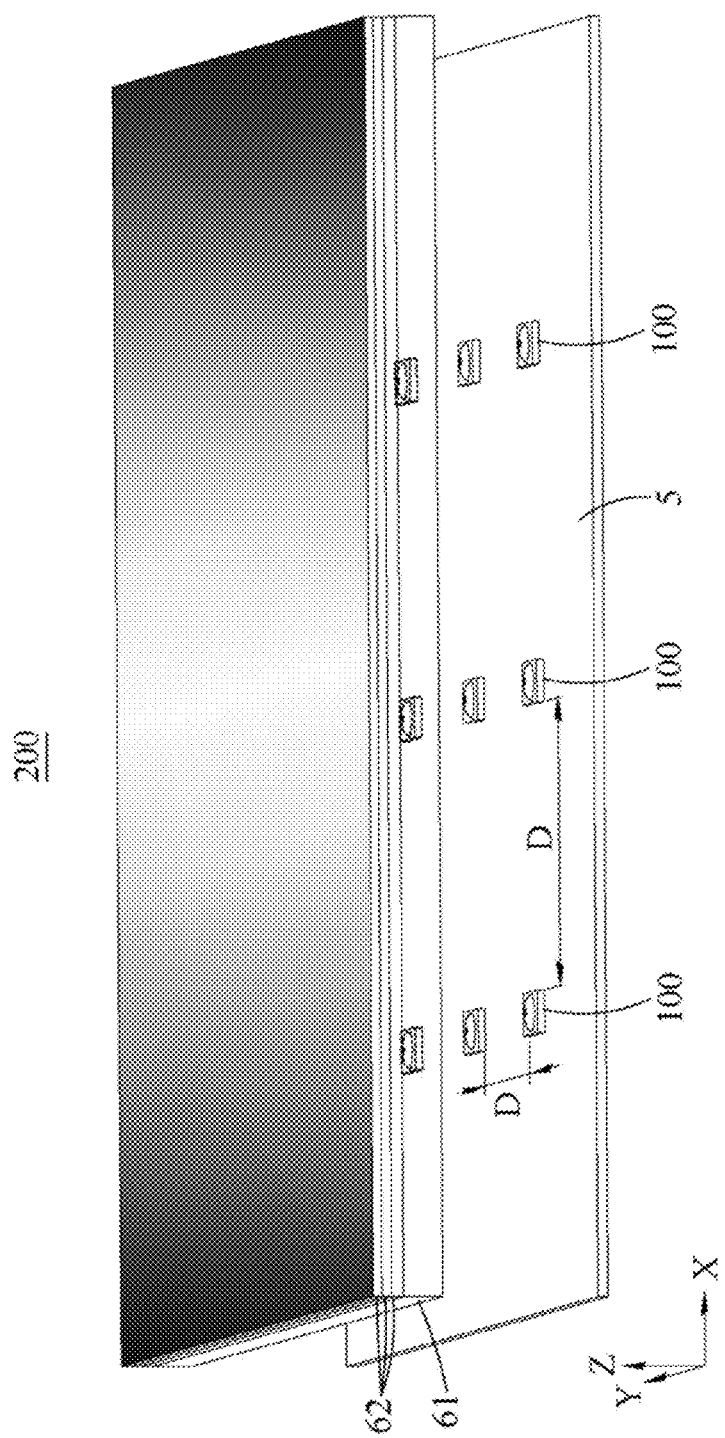
FIG. 11 illustrates a schematic diagram of an arrangement appearance of the light-emitting device in a backlight module according to some embodiments.

Referring to FIG. 11, FIG. 11 is a schematic diagram of an arrangement appearance of the light-emitting device 100 in a backlight module 200. In some embodiments, 9 light-emitting devices 100 are arranged in the backlight module 200 to manufacture a backlight module 200 with an OD distance being equal to 5 mm and an area being 50 mm×50 mm. By taking the epoxy resin as the encapsulation glue material as an example, the refractive index is 1.52. By adjusting the distance of the spacing D of the light-emitting diodes 2 between the X axis and the Y axis, the optical effect is tested to determine the application range of 9 light-emitting devices 100.

Figure 12B:
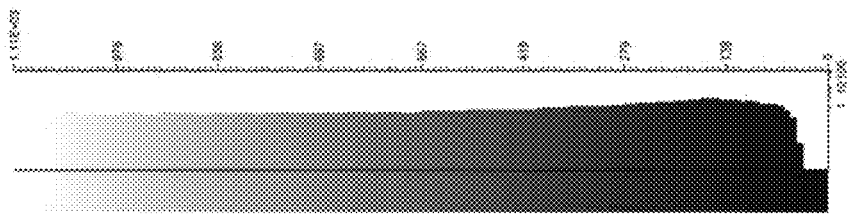
FIGS. 12a and 12b illustrate a schematic diagram of an optical effect of the light-emitting device in the backlight module with an arrangement that a spacing D of the light-emitting devices 100 at an X axis is 13 mm and a spacing D at a Y axis is 13 mm according to some embodiments.
Figure 12A:
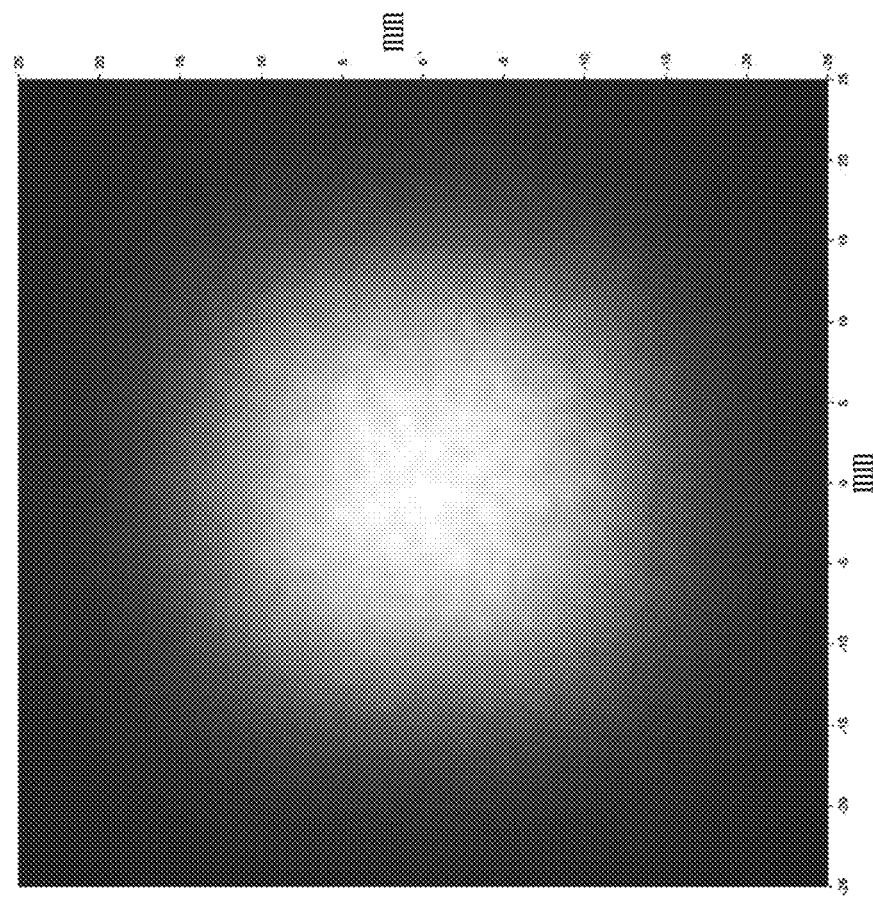
Figure 13B:
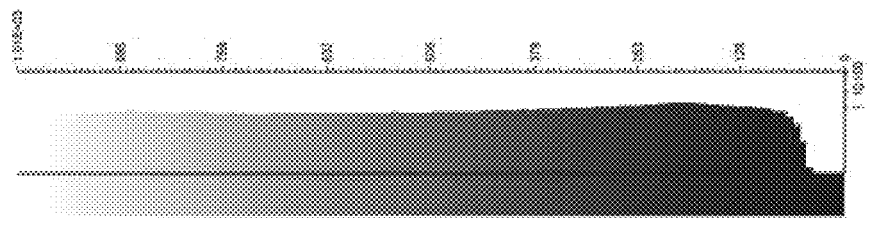
FIGS. 13a and 13b illustrate a schematic diagram of an optical effect of the light-emitting device in the backlight module with an arrangement that a spacing D of the light-emitting devices 100 at an X axis is 16 mm and a spacing D at a Y axis is 16 mm according to some embodiments.
Figure 13A:
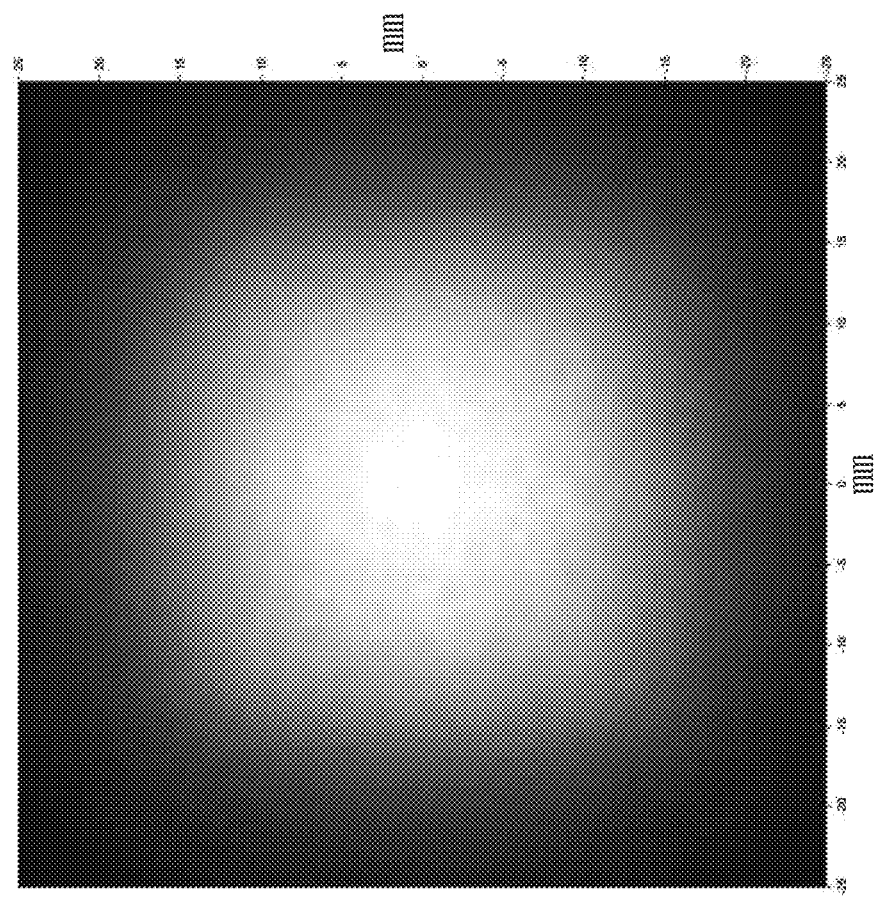
Figure 14B:
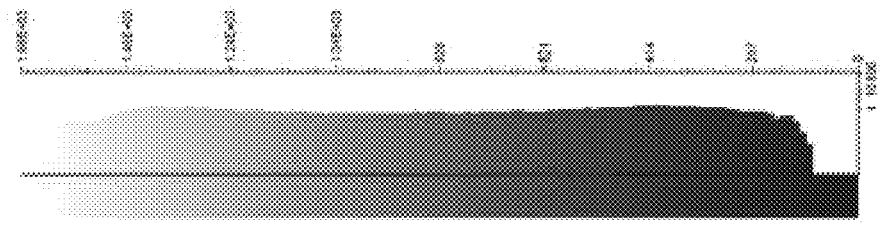
FIGS. 14a and 14b illustrate a schematic diagram of an optical effect of the light-emitting device in the backlight module with an arrangement that a spacing D of the light-emitting devices 100 at an X axis is 17 mm and a spacing D at a Y axis spacing D is 17 mm according to some embodiments.
Figure 14A:
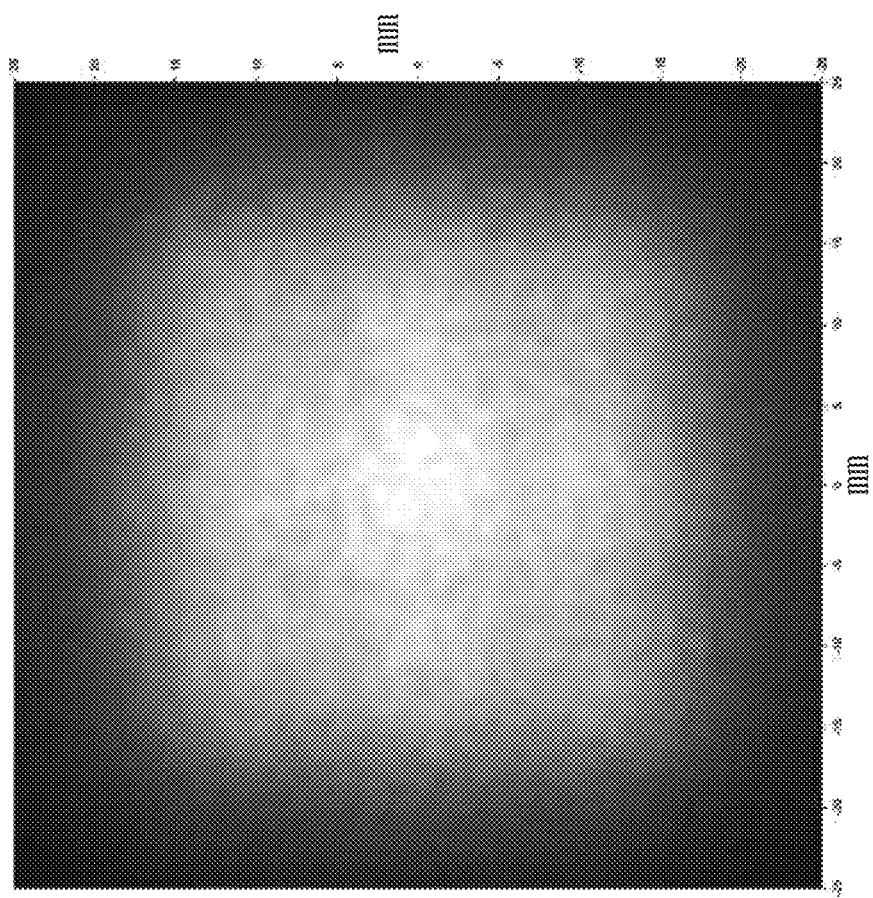

Referring to FIG. 11 to FIG. 14b, FIGS. 12a to FIG. 14b are schematic diagrams of optical effects of the light-emitting device 100 in the backlight module 200. FIG. 12 (FIGS. 12a and 12b) is an arrangement of the light-emitting devices 100 with a spacing D at the X axis being 13 mm and a spacing D at the Y axis being 13 mm. FIG. 13 (FIGS. 13a and 13b) is an arrangement of the light-emitting devices 100 with a spacing D at the X axis being 16 mm and a spacing D at the Y axis being 16 mm. FIG. 14 (FIGS. 14a and 14b) is an arrangement of the light-emitting devices 100 with a spacing D at the X axis being 17 mm and a spacing D at the Y axis being 17 mm. In some embodiments, the optical effects of the backlight module 200 consisting of 9 light-emitting devices 100, having the same distance in the X axis and the Y axis directions and having a value range of the spacing D of 13 mm to 17 mm are tested, and determination is made according to the obvious degree of checkerboard dark shadows in the shown effects. In some embodiments, the spacing D of the maximum distribution arrangement of the light-emitting devices 100 in the X axis and Y axis directions on a circuit board 5 is 16 mm (as shown in FIG. 11 and FIG. 13). If the spacing D between the light-emitting devices 100 exceeds 16 mm (as shown in FIG. 14), a checkerboard dark shadow phenomenon will become very obvious, and the effect is poor.

The optical effects of a backlight module consisting of 9 general Mini LEDs, having the same distances in the X axis and the Y axis directions and having a value range of 7 mm to 11 mm are tested, and determination is made according to the obvious degree of checkerboard dark shadows in the shown effects. The limit arrangement distance of the general Mini LEDs in the X axis and Y axis directions is 10 mm. If the spacing between the LEDs exceeds 11 mm, a checkerboard dark shadow phenomenon will become very obvious, and the effect is poor.

Referring to FIG. 11, in some embodiments, the maximum arrangement spacing D of the light-emitting devices 100 in the X axis and Y axis directions on the circuit board 5 in the backlight module 200 can reach 16 mm, and the value is greatly improved through being compared with the spacing D of the maximum arrangement distance of 10 mm of the general Mini LEDs in the X axis and Y axis directions.

Figure 15:
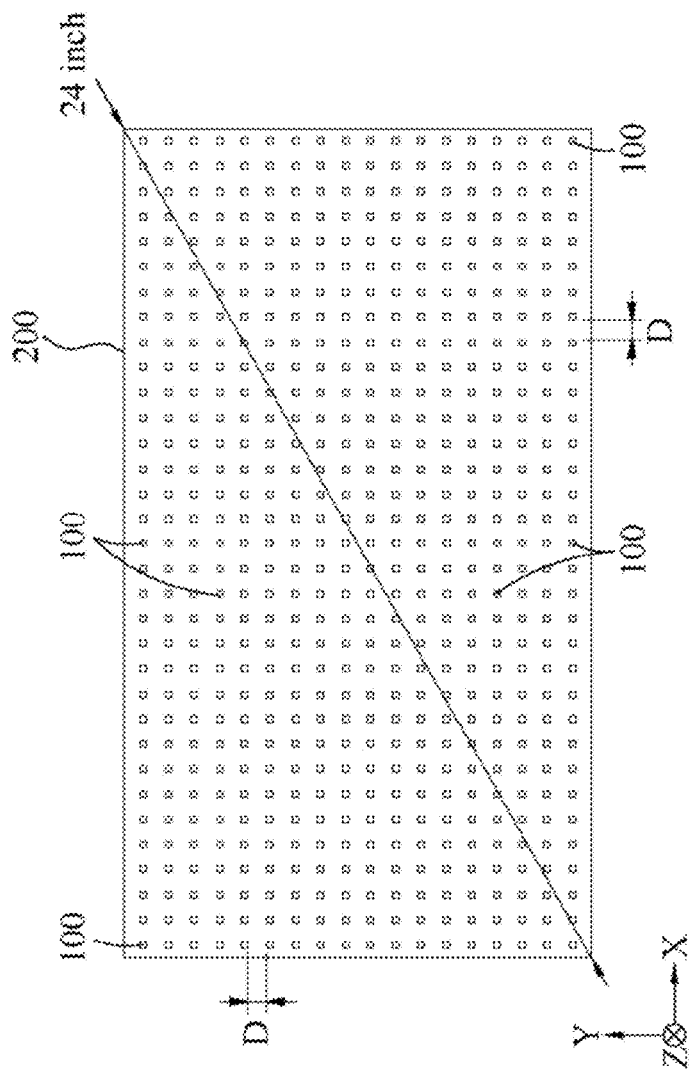
FIG. 15 illustrates a schematic top view of an arrangement of the light-emitting device in the backlight module according to some embodiments.

Referring to FIG. 15, FIG. 15 is a schematic top view of an arrangement of the light-emitting device 100 in the backlight module 200. In some embodiments, by taking a 24-inch backlight module 200 as an example, when the light-emitting devices 100 are used for arrangement, the light-emitting devices are arranged at a spacing D equal to 16 mm in a cavity of the whole backlight module 200 in the X axis and Y axis directions, and 33×18, totaling 594 light-emitting devices 100 are needed. The quantity of the light-emitting devices 100 in the backlight module 200 in the same size and the cost are effectively reduced. When the general Mini LEDs are used for arrangement, the Mini LEDs are arranged at the spacing D equal to 10 mm in the cavity of the whole backlight module 200 in the X axis and Y axis directions, and 53×29, totaling 1537 LEDs are needed. By taking the arrangement of a 24-inch backlight module 200 as an example (as shown in FIG. 15), and by the cost of using the light-emitting devices 100, 61.35% by the cost of the original light-emitting devices 100 will be reduced. When the size of the backlight module 200 is further increased, the cost reduction amplitude is obviously improved.

In some embodiments, the cost is calculated by the same LED single price and the quantity differences, and the cost of using the light-emitting diodes 2 of the light-emitting devices 100 is reduced by 61.35% through being compared with the cost of the general Mini LEDs. When the size of the backlight module 200 is further increased, the quantity of the light-emitting devices 100 and the cost are further reduced.

In some embodiments, the plurality of light-emitting devices 100 can be arranged in the same direction (for example, an appearance of the lens 32 in a donut shape is arranged in the same direction of the longitudinal direction), and are distributed in the cavity of the whole backlight module 200 in the same direction in the X axis and Y axis directions at a spacing D, but it is not limited thereto. In some embodiments, the plurality of light-emitting devices 100 can be arranged in different directions (for example, an appearance of the lens 32 in a donut shape in transverse arrangement and an appearance of the lens 32 in a donut shape in longitudinal arrangement are used at the same time), and are distributed in the cavity of the whole backlight module 200 in different directions in the X axis and Y axis directions at the spacing D.

Figure 16:
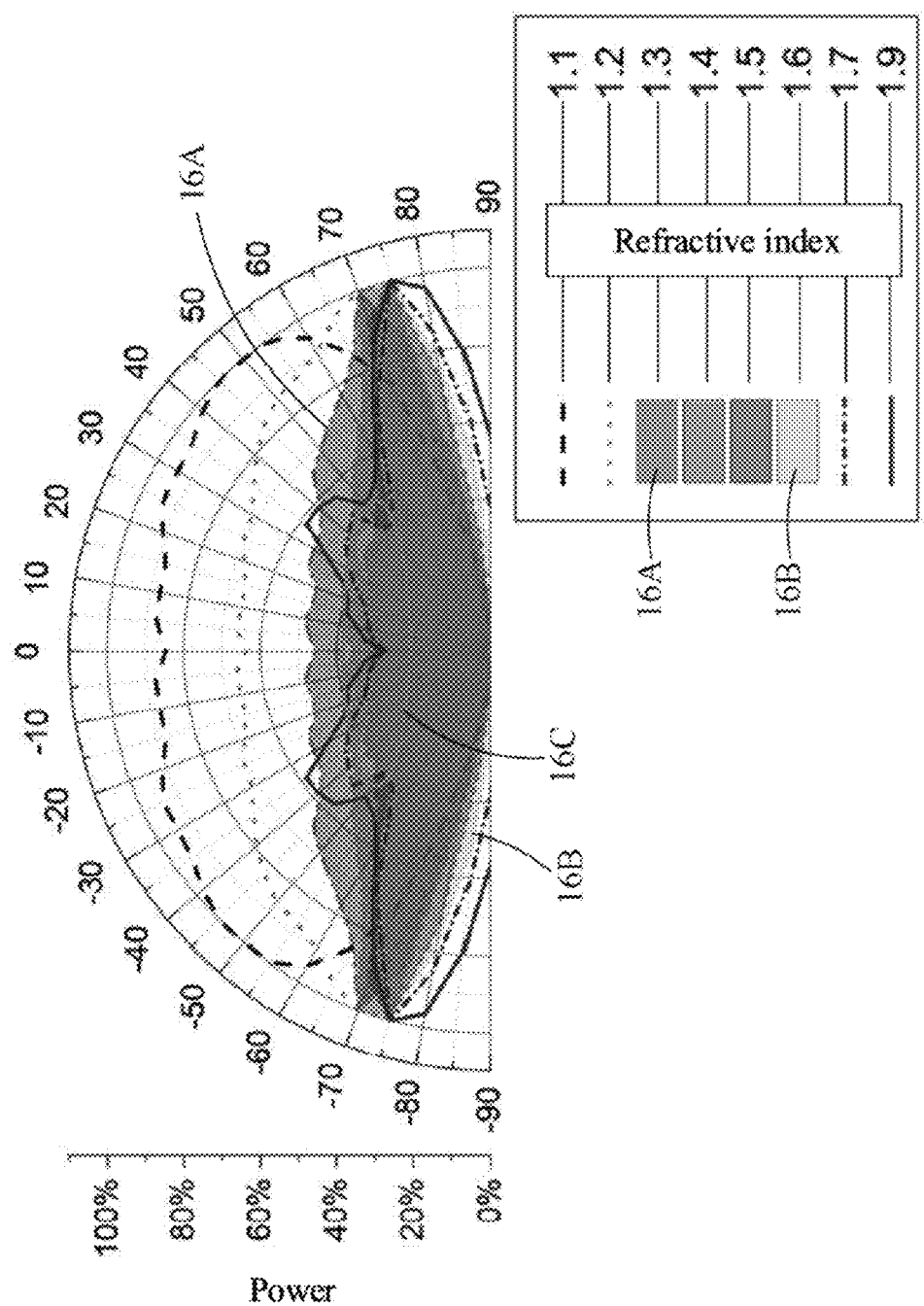
FIG. 16 illustrates a schematic diagram of a refractive index of the light-emitting device in a light distribution curve with a refractive index range of 1.1 to 1.9 according to some embodiments.

Referring to FIG. 16, FIG. 16 is a schematic diagram of a refractive index of the light-emitting device 100 in a light distribution curve with a refractive index range of 1.1 to 1.9. In some embodiments, when the light-emitting device 100 selects the encapsulation glue material, the encapsulation glue material is selected from the test light distribution curve of the encapsulation glue material with the refractive index range of 1.1 to 1.9. At 50% power, the light-emitting angle of the light-emitting device 100 increases along with the increase of the refractive index. When the refractive index of the encapsulation glue is lower than 1.3 (as shown by mark 16A in the figure), the light-emitting angle of the light-emitting device 100 at the 50% power is not obviously improved. When the refractive index of the encapsulation glue is greater than 1.6 (as shown by mark 16B in the figure), it can be seen that the light distribution curve of the light-emitting device 100 in the center portion region has an obvious bulge (an oval region of mark 16C), it shows that the brightness of the center portion region of the light-emitting diode 2 will be obviously higher, the light spot is nonuniform, and it is not applicable to a daily scene. The approximate required range of the light-emitting device 100 on the refractive index of the encapsulation glue material is 1.4 to 1.6.

Figure 17:
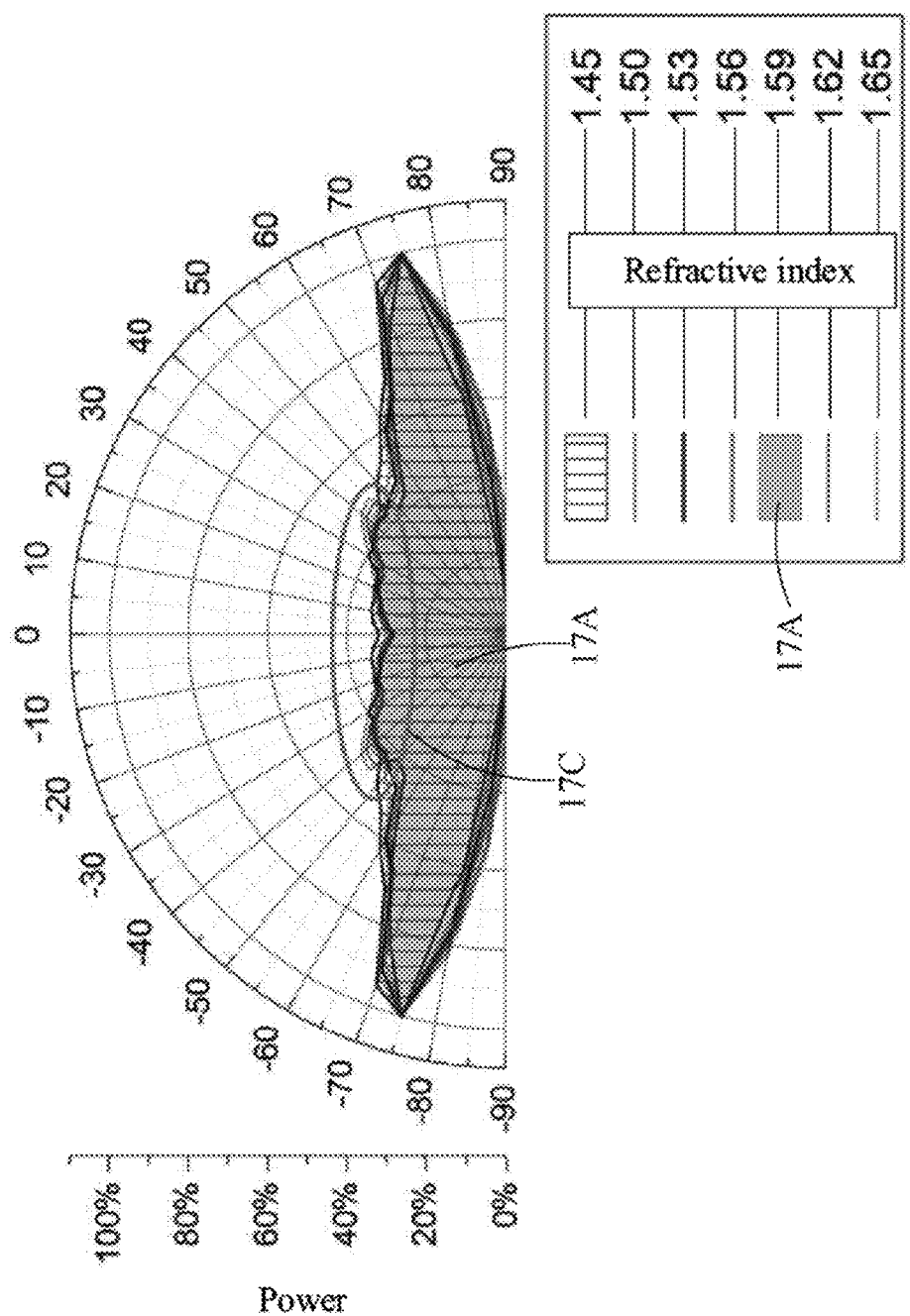
FIG. 17 illustrates a schematic diagram of a refractive index of the light-emitting device in a light distribution curve with a refractive index range of 1.45 to 1.65 according to some embodiments.

Referring to FIG. 17, FIG. 17 is a schematic diagram of a refractive index of the light-emitting device 100 in a light distribution curve with a refractive index range of 1.45 to 1.65. In some embodiments, the encapsulation glue material with the refractive index range of 1.45 to 1.65 is subjected to a fine division test again. From the light distribution curve of the light-emitting device 100, it can be seen that when the refractive index of the encapsulation glue is greater than 1.59 (as shown by mark 17A in the figure), the light distribution curve of the light-emitting device 100 in the center portion region has an obvious bulge (an oval region of mark 17C). The optimum selection range of the refractive index of the encapsulation glue material is 1.45 to 1.59.

In some embodiments, the encapsulation body 3 can be made of an encapsulation glue material of epoxy resin, silicone or silicone resin, and can be matched with the required refractive index.

Figure 18:
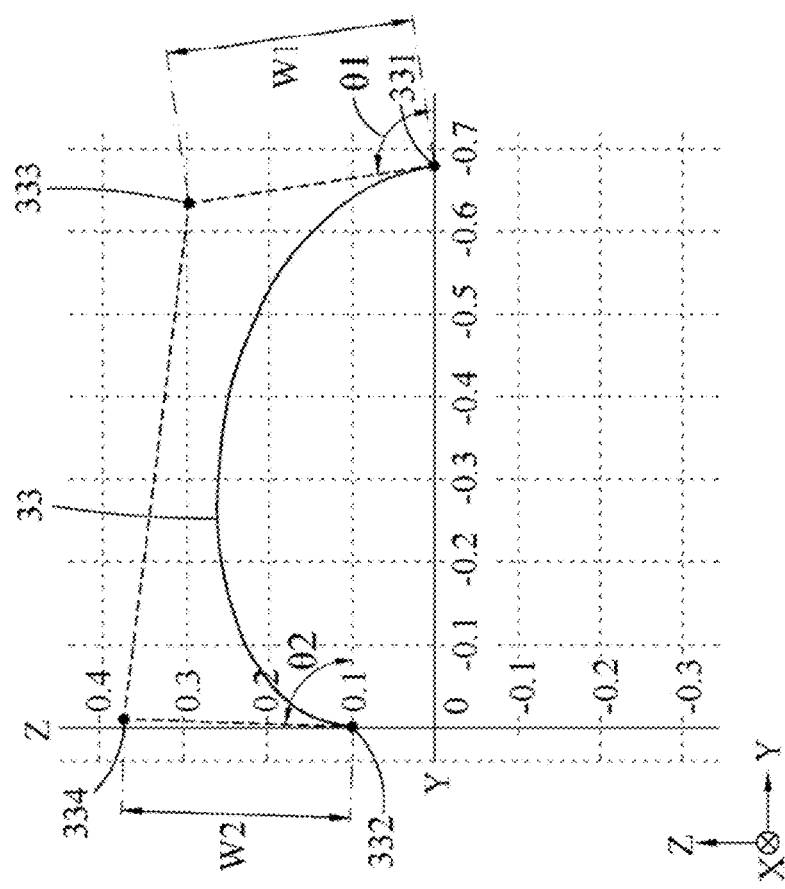
FIG. 18 illustrates a schematic diagram of an appearance of the cubic Bezier curve at a maximum parameter value according to some embodiments.
Figure 19:
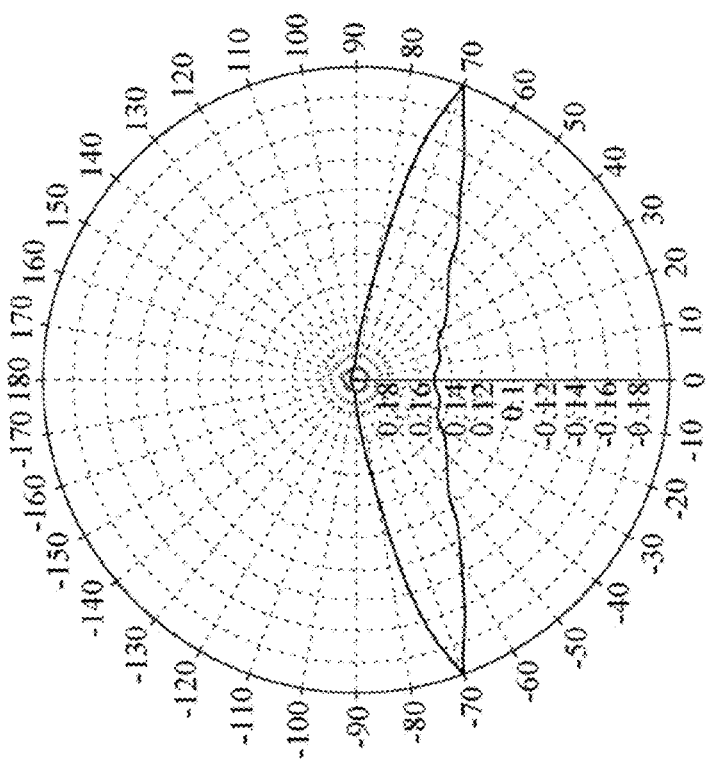
FIG. 19 illustrates a schematic diagram of the refractive index of the cubic Bezier curve at the maximum parameter value in the light distribution curve according to some embodiments.
Figure 22:
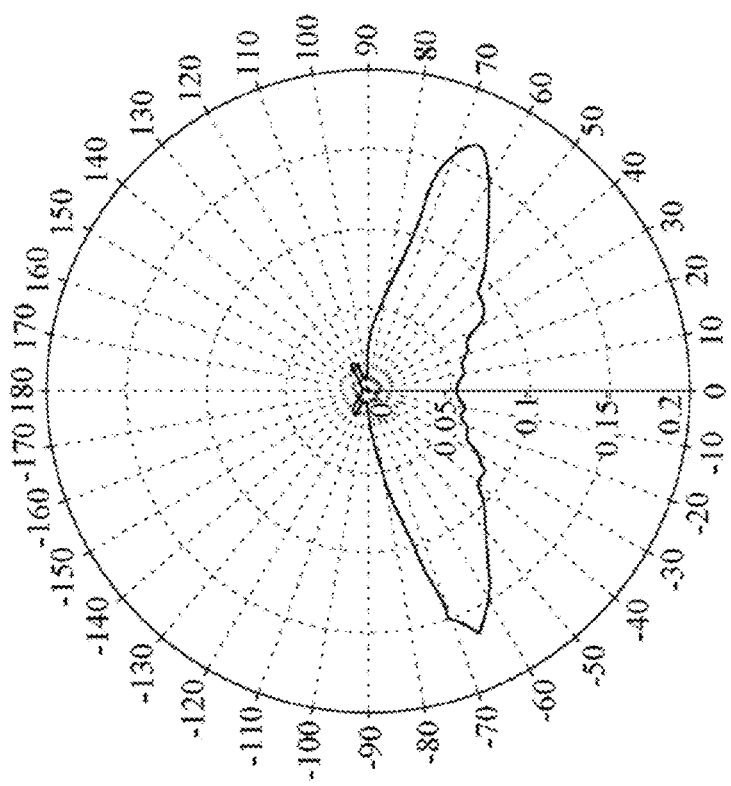
FIG. 22 illustrates a schematic diagram of a refractive index of the cubic Bezier curve at the minimum parameter value in the light distribution curve according to some embodiments.
Figure 21:
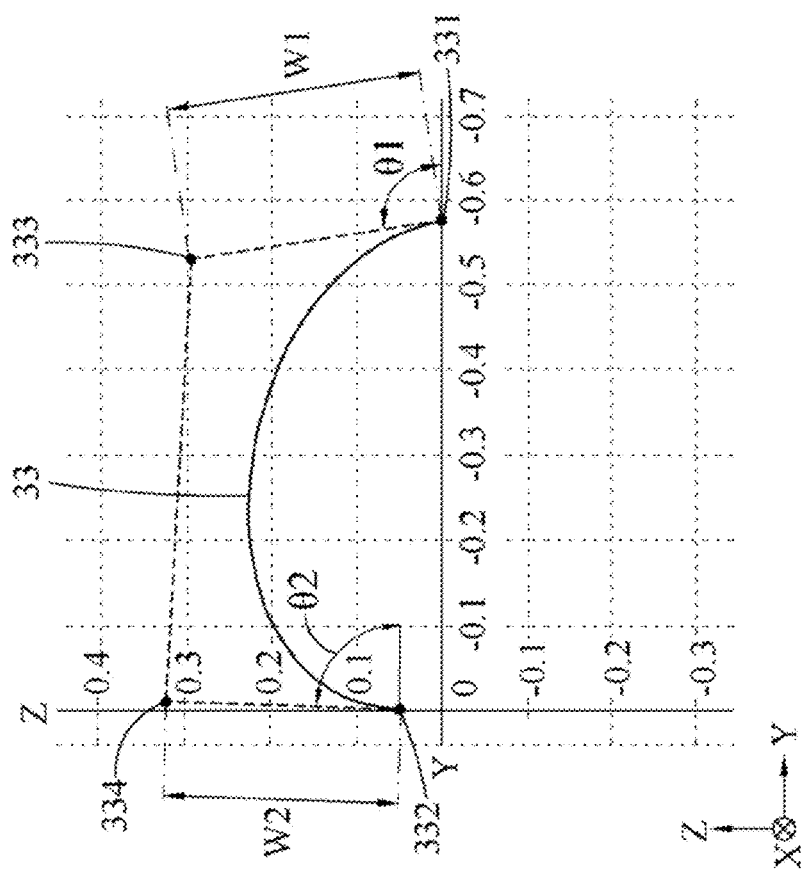
FIG. 21 illustrates a schematic diagram of an appearance of the cubic Bezier curve at a minimum parameter value according to some embodiments.
Figures 23A, 23B:
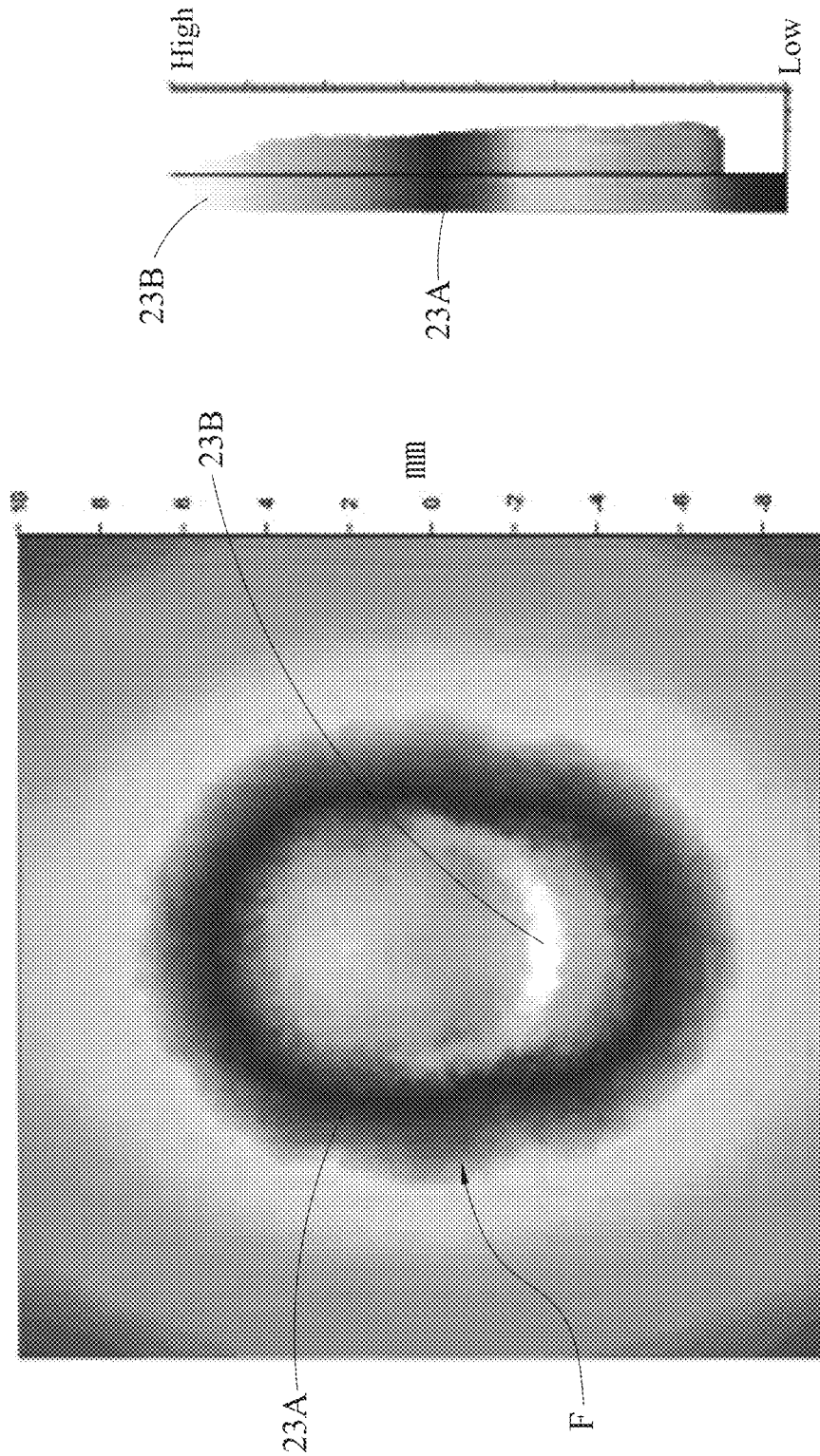
FIGS. 23a and 23b illustrate a schematic diagram of a light spot of the cubic Bezier curve at the minimum parameter value according to some embodiments.

Referring to FIG. 18 to FIG. 23*b*, FIG. 18 is a schematic diagram of an appearance of the cubic Bezier curve 33 at a maximum parameter value. FIG. 19 is a schematic diagram of the refractive index of the cubic Bezier curve 33 at the maximum parameter value in the light distribution curve. FIG. 20 is a (FIGS. 20*a* and 20*b*) schematic diagrams of a light spot of the cubic Bezier curve 33 at the maximum parameter value. FIG. 21 is a schematic diagram of an appearance of the cubic Bezier curve 33 at a minimum parameter value. FIG. 22 is a schematic diagram of a refractive index of the cubic Bezier curve 33 at the minimum parameter value in the light distribution curve. FIG. 23 (FIGS. 23*a* and 23*b*) is a schematic diagram of a light spot of the cubic Bezier curve 33 at the minimum parameter value. In some embodiments, through the shape of the light distribution curve and the light spot effect of the light-emitting device 100, the parameter value range of the cubic Bezier curve 33 is determined.

Referring to FIG. 18 to FIG. 20 (FIGS. 20*a* and 20*b*), FIG. 18 to FIG. 20 are schematic diagrams of the appearance, the light distribution curve and the light spot of the cubic Bezier curve 33 at the maximum parameter value. In some embodiments, the maximum parameter value of the cubic Bezier curve 33 is as follows: a coordinate of the start point 331 is (−91%×length L of the base 31 (as shown in FIG. 4)/2, the Y axis being substantially equal to 0), a start point angle $\theta 1$ is tan $\beta$ equal to 8.80, a start point weight is 0.50, a start point tangent length W1 is 0.300 mm, a coordinate of the end point 332 is (the Z axis being substantially equal to 0, 33%×the height H of the base 31 (as shown in FIG. 4)), an end point angle $\theta 2$ is tan $\alpha$ equal to −1.75, an end point weight is 0.46, and an end point tangent length W2 is 0.275 mm. As shown in FIGS. 20*a* and 20*b*, the intensity of two inside regions mark 20B in the oval light spot F (as shown by 20A in the figure) is the highest, the two inside regions mark 20B correspond to the highest value portion of 20B at the upper side of the energy chart at the right side in the figure, the light is diffused, and the light range is increased.

Referring to FIG. 21 to FIG. 23 (FIGS. 23*a* and 23*b*), FIG. 21 and FIG. 23 are schematic diagrams of the appearance, the light distribution curve and the light spot of the cubic Bezier curve 33 at the minimum parameter value. In some embodiments, a minimum parameter value of the cubic Bezier curve 33 is as follows: a coordinate of the start point 331 is (−77%×the length L of the base 31/2, the Y axis being substantially equal to 0), a start point angle $\theta 1$ is tan $\beta$ equal to 8.80, a start point weight is 0.44, a start point tangent length W1 is 0.300 mm, a coordinate of the end point 332 is (the Z axis being substantially equal to 0, 17%×the height H of the base 31), an end point angle $\theta 2$ is tan $\alpha$ equal to −1.75, an end point weight is 0.42, and an end point tangent length W2 is 0.275 mm. As shown in FIG. 23, the intensity of a lower inside region mark 23B in the oval light spot F (as shown by mark 23A in the figure) is the highest, the inside region mark 23B corresponds to a highest value portion of mark 23B at the upper side of the energy chart at the right side in the figure, the light is diffused, and the light range is increased.

Referring to FIG. 1 to FIG. 5, in some embodiments, a light-emitting device 100 is provided, which includes a substrate 1, a light-emitting diode 2 and an encapsulation body 3. The light-emitting diode 2 is located at one side of the substrate 1. The encapsulation body 3 is located at one side of the substrate 1 and covers the light-emitting diode 2. The encapsulation body 3 includes a base 31 and a lens 32. The lens 32 corresponds to a position above the light-emitting diode 2. The lens 32 has a lens surface 321. The lens surface 321 conforms to a cubic Bezier curve 33. The cubic Bezier curve 33 has a start point 331 and an end point 332. The start point 331 is located at a base surface 311 of the base 31. The end point 332 corresponds to a position above the light-emitting diode 2 (for example, but not limited to the center of the light-emitting diode 2). The lens surface 321 is provided with a gradually reducing concave portion 34 bending to form an arc shape from outside to inside at the end point 332. The concave portion 34 can be a three-dimensional cone or a three-dimensional arc cone. The concave portion 34 has a conical appearance, the conical appearance tapers from the lens surface 321 toward the light-emitting diode 2.

In some embodiments, through the cross section of the lens surface 321, it can be known that the bottom of the concave portion 34 is provided with a sharp protruding portion 341. A wall surface of the inner side of the concave portion 34 is provided with a bending arc portion 342 in a bending arc curve surface shape. Through being observed from the three-dimensional appearance of the lens, it can be seen that the bending arc shape of the concave portion 34 is different from a flat-bottomed groove (not shown in the figure) in the center of the lens of a general Mini LED.

Referring to FIG. 11, in some embodiments, a backlight module 200 is provided, which includes a circuit board 5, a plurality of light-emitting devices 100, a diffusion sheet 61 and a plurality of optical films 62 (polarizers or/and films with diffusion functions and the like).

Referring to FIG. 1, FIG. 4, FIG. 5 and FIG. 11, in some embodiments, the light-emitting devices 100 are located on the circuit board 5. The light-emitting device 100 includes a substrate 1, a light-emitting diode 2 and an encapsulation body 3. The light-emitting diode 2 is located at one side of the substrate 1. The encapsulation body 3 is located at one side of the substrate 1, and covers the light-emitting diode 2. The encapsulation body 3 includes a base 31 and a lens 32. The lens 32 corresponds to a position above the light-emitting diode 2. The lens 32 has a lens surface 321. The lens surface 321 conforms to a cubic Bezier curve 33. The cubic Bezier curve 33 has a start point 331 and an end point 332. The start point 331 is located at a base surface 311 of the base 31. The end point 332 corresponds to a position above the light-emitting diode 2 (for example, but not limited to the center of the light-emitting diode 2). The lens surface 321 is provided with a concave portion 34 at the end point 332. The diffusion sheet 61 is located above the circuit board 5 and has an interval from the circuit board. Each of the optical films 62 is located on the diffusion sheet 61.

Based on the above, according to some embodiments, the light-emitting device is provided with the lens for forming the lens surface by the cubic Bezier curve. The lens increases the light-emitting angle of the light-emitting diode. Under the conditions of occupying the same use area in the backlight module and ensuring the image effect, the spacing between light-emitting devices can be increased, thereby greatly reducing the number of light-emitting devices to be used and reducing the cost of the whole backlight module.

What is claimed is:

1. A light-emitting device, comprising:
a substrate;
a light-emitting diode, located at one side of the substrate; and
an encapsulation body, located at the side of the substrate and covering the light-emitting diode, wherein the encapsulation body comprises a base and a lens, the lens corresponds to a position above the light-emitting diode, the lens has a lens surface, the lens surface is a light-exiting surface of the lens, the lens surface conforms to a cubic Bezier curve, the cubic Bezier curve has a start point and an end point, the start point of the cubic Bezier curve is located at a base surface of the base, the end point of the cubic Bezier curve corresponds to a position above the light-emitting diode, and the lens surface is provided with a concave portion at the end point.

2. The light-emitting device according to claim 1, wherein the lens surface is a curve surface formed by rotating the cubic Bezier curve for 360 degrees around a center axis, the center axis is a plumb line passing through the end point, the plumb line and a Z axis are located on a first axial line, a plumb tangent plane of the base surface is located on a second axial line as a Y axis, the Z axis intersects with and is vertical to the Y axis, the start point is located in a coordinate position with the Y axis being substantially equal to 0, and the end point is located in a coordinate position with the Z axis being substantially equal to 0.

3. The light-emitting device according to claim 2, wherein the base has a height and a length, a parameter value range of the cubic Bezier curve is as follows: a coordinate range of the start point is (−77%×the length/2, the Y axis being substantially equal to 0) to (−91%×the length/2, the Y axis being substantially equal to 0), a start point angle is formed by the start point between the Y axis and a tangent line tangent to the cubic Bezier curve, the start point angle is tan β equal to 8.80, a start point weight is 0.44 to 0.50, a start point tangent length is 0.300 mm, a coordinate of the end point is (17%×the height, the Z axis substantially equal to 0) to (33%×the height, the Z axis substantially equal to 0), an end point angle is formed by the end point between the Z axis and the tangent line tangent to the cubic Bezier curve, the end point angle is tan α equal to −1.75, an end point weight is 0.42 to 0.46, and an end point tangent length is 0.275 mm.

4. The light-emitting device according to claim 3, wherein the encapsulation body is made of an encapsulation glue material, and a refractive index range of the lens is 1.45 to 1.59.

5. The light-emitting device according to claim 1, wherein the encapsulation body is made of an encapsulation glue material, and a refractive index of the lens is 1.52.

6. The light-emitting device according to claim 1, wherein the encapsulation body is made of an encapsulation glue material of epoxy resin, silicone or silicone resin.

7. The light-emitting device according to claim 1, wherein a light-emitting angle of the lens is 166.30 degrees at 50% power of light distribution curve calculation.

8. The light-emitting device according to claim 1, wherein a light spot covering range with an area of 94.20 $mm^2$ is measured in a position being 5 mm above the light-emitting diode.

9. The light-emitting device according to claim 3, wherein a ratio of the height of the base to the length of the base is 1/8:1/2.

10. The light-emitting device according to claim 3, wherein the height of the base is 0.3 mm, and the length of the base is 1.3 mm.

11. The light-emitting device according to claim 3, wherein a size of the light-emitting diode is 75 μm to 300 μm.

12. The light-emitting device according to claim 1, wherein the lens surface is a curve surface formed by rotating the cubic Bezier curve for 360 degrees around a center axis, the center axis is a plumb line passing through the end point, the plumb line and a Z axis are located on a first axial line, a plumb tangent plane of the base surface is located on a second axial line as a Y axis, the Z axis intersects with and is vertical to the Y axis, the start point is located in a coordinate position with the Y axis being substantially equal to 0, and the end point is located in a coordinate position with the Z axis being substantially equal to 0; the base has a height and a length, a parameter value range of the cubic Bezier curve is as follows: a coordinate range of the start point is (−77%×the length/2, the Y axis being substantially equal to 0) to (−91%×the length/2, the Y axis being substantially equal to 0), a start point angle is formed by the start point between the Y axis and a tangent line tangent to the cubic Bezier curve, the start point angle is tan β equal to 8.80, a start point weight is 0.44 to 0.50, a start point tangent length is 0.300 mm, a coordinate of the end point is (17%×the height, the Z axis being substantially equal to 0) to (33%×the height, the Z axis being substantially equal to 0), an end point angle is formed by the end point between the Z axis and the tangent line tangent to the cubic Bezier curve, the end point angle is tan α equal to −1.75, an end point weight is 0.42 to 0.46, and an end point tangent length is 0.275 mm; the encapsulation body is made of an encapsulation glue material, and a refractive index of the lens is 1.52; the encapsulation body is made of an encapsulation glue material of epoxy resin, silicone or silicone resin; a light-emitting angle of the lens is 166.30 degrees at 50% power of light distribution curve calculation; a light spot covering range with an area of 94.20 mm$^2$ is measured in a position being 5 mm above the light-emitting diode; and the height of the base is 0.3 mm, and the length of the base is 1.3 mm.

13. The light-emitting device according to claim 1, wherein the lens surface is provided with a gradually reducing concave portion bending to form an arc shape from outside to inside at the end point, the concave portion has a conical appearance, the conical appearance tapers from the lens surface toward the light-emitting diode.

14. A backlight module, comprising:
a circuit board;
a plurality of light-emitting devices, wherein each of the light-emitting devices is located on the circuit board and comprises a substrate, a light-emitting diode and an encapsulation body, the light-emitting diode is located at one side of the substrate, the encapsulation body is located at the side of the substrate and covers the light-emitting diode, the encapsulation body comprises a base and a lens, the lens corresponds to a position above the light-emitting diode, the lens has a lens surface, the lens surface is a light-exiting surface of the lens, the lens surface conforms to a cubic Bezier curve, the cubic Bezier curve has a start point and an end point, the start point of the cubic Bezier curve is located at a base surface of the base, and the end point of the cubic Bezier curve corresponds to a position above the light-emitting diode, and the lens surface is provided with a concave portion at the end point;
a diffusion sheet, located above the circuit board and having an interval from the circuit board; and
a plurality of optical films, wherein each of the optical films is located on the diffusion sheet.

15. The backlight module according to claim 14, wherein an X axis and a Y axis in intersecting, vertical and horizontal states are defined on the circuit board, each of the light-emitting devices is disposed at an arrangement distance of 16 mm in the X axis and Y axis directions on the circuit board.

16. The backlight module according to claim 14, wherein the lens surface is a curve surface formed by rotating the cubic Bezier curve for 360 degrees around a center axis, the center axis is a plumb line passing through the end point, the plumb line and a Z axis are located on a first axial line, a plumb tangent plane of the base surface is located on a second axial line as the Y axis, the Z axis intersects with and is vertical to the Y axis, the start point is located in a coordinate position with the Y axis being substantially equal to 0, and the end point is located in a coordinate position with the Z axis being substantially equal to 0.

17. The backlight module according to claim 16, wherein the base has a height and a length, a parameter value range of the cubic Bezier curve is as follows: a coordinate range of the start point is (−77%×the length/2, the Y axis being substantially equal to 0) to (−91%×the length/2, the Y axis being substantially equal to 0), a start point angle is formed by the start point between the Y axis and a tangent line tangent to the cubic Bezier curve, the start point angle is tan β equal to 8.80, a start point weight is 0.44 to 0.50, a start point tangent length is 0.300 mm, a coordinate of the end point is (17%×the height, the Z axis being substantially equal to 0) to (33%×the height, the Z axis being substantially equal to 0), an end point angle is formed by the end point between the Z axis and the tangent line tangent to the cubic Bezier curve, the end point angle is tan α equal to −1.75, an end point weight is 0.42 to 0.46, and an end point tangent length is 0.275 mm.

18. The backlight module according to claim 16, wherein the encapsulation body is made of an encapsulation glue material, and a refractive index of the lens is 1.52; a light-emitting angle of the lens is 166.30 degrees at 50% power of light distribution curve calculation; a light spot covering range with an area of 94.20 mm$^2$ is measured in a position being 5 mm above the light-emitting diode; and the height of the base is 0.3 mm, and the length of the base is 1.3 mm.

19. A light-emitting device, comprising:
a substrate;
a light-emitting diode, located at one side of the substrate; and
an encapsulation body, located at the side of the substrate and covering the light-emitting diode, wherein the encapsulation body comprises a base and a lens, the lens corresponds to a position above the light-emitting diode, the lens has a lens surface, the lens surface is a light-exiting surface of the lens, the lens surface conforms to a cubic Bezier curve, the cubic Bezier curve has a start point and an end point, the start point of the cubic Bezier curve is located at a base surface of the base, the end point of the cubic Bezier curve corresponds to a position above the light-emitting diode, the lens surface is provided with a concave portion at the end point, the cubic Bezier curve forms a continuous curve surface from the start point to the end point, and the continuous curve surface has an inward-protruding curve surface at the concave portion of the end point.

\* \* \* \* \*